United States Patent [19]
Doring et al.

[11] Patent Number: 6,084,756
[45] Date of Patent: Jul. 4, 2000

[54] APPARATUS FOR TESTING PROTECTION OF AN ELECTRIC POWER DISTRIBUTION CIRCUIT BY AN ARC FAULT CIRCUIT BREAKER

[75] Inventors: Thomas M. Doring, Wexford; Ralph Mason Ennis, Imperial; Joseph Charles Engel, Monroeville, all of Pa.

[73] Assignee: Eaton Corporation, Cleveland, Ohio

[21] Appl. No.: 09/235,715

[22] Filed: Jan. 22, 1999

[51] Int. Cl.⁷ .................................................. H02H 3/16
[52] U.S. Cl. ................................. 361/45; 361/2; 361/6; 335/18; 335/195; 324/527; 324/536
[58] Field of Search ........................... 361/2, 3, 88, 91.1, 361/52, 45, 42; 335/18, 195, 194; 324/512, 527, 536

[56] References Cited

U.S. PATENT DOCUMENTS

| | | | |
|---|---|---|---|
| 4,144,487 | 3/1979 | Pharney | 324/522 |
| 4,549,132 | 10/1985 | Yamagiwa et al. | 324/538 |
| 5,224,006 | 6/1993 | MacKenzie et al. | 361/45 |
| 5,293,522 | 3/1994 | Fello et al. | 335/18 |
| 5,459,630 | 10/1995 | Mackenzie et al. | 361/45 |
| 5,691,869 | 11/1997 | Engel et al. | 361/42 |
| 5,694,099 | 12/1997 | Connell et al. | 335/78 |
| 5,969,920 | 10/1999 | Mackenzie | 361/42 |

*Primary Examiner*—Jeffrey Gaffin
*Assistant Examiner*—Kim Huynh
*Attorney, Agent, or Firm*—Martin J. Moran

[57] ABSTRACT

A tester for an arc fault circuit breaker plugs into a socket in the protected branch circuit. An actuator includes a first spring biasing a moveable contact carried by a pivoted contact arm away from a fixed contact and a momentary closer for momentarily closing the contacts. The momentary closer includes a push button and a second spring coupling the push button to the pivoted contact arm to close the contacts when actuated. Closing of the contacts completes a circuit across the branch circuit resulting in a current producing a magnetic repulsion force which blows the contacts open thereby striking an arc. The arc, which should trip the arc fault circuit breaker is visible through a translucent or transparent section of the molded tester housing. A fuse interrupts any overcurrent and a test light verifies initial energization of the protected circuit and operation of the arc fault circuit breaker.

15 Claims, 2 Drawing Sheets

APPARATUS FOR TESTING PROTECTION OF AN ELECTRIC POWER DISTRIBUTION CIRCUIT BY AN ARC FAULT CIRCUIT BREAKER

BACKGROUND OF THE INVENTION

1. Field of the Invention

This invention relates to an apparatus for protecting electric power distribution circuits from arc faults. More particularly, it relates to an apparatus which tests the response of an arc fault circuit breaker to an arc generated in the electrical circuit remotely from the circuit breaker.

2. Background Information

Conventionally, circuit breakers have provided protection in electric power distribution circuits against short circuits and current overloads. Recently, there has been rising interest in also protecting such power distribution circuits, and particularly the branch circuits in homes, commercial and light industry applications from arc faults. Typically, miniature circuit breakers are used in such applications. These miniature circuit breakers utilize a thermo-magnetic trip device which incorporates a bimetal responsive to persistent overload conditions and a magnetic armature responsive to the large magnetic forces generated by a short-circuit current. Arc faults are intermittent high impedance faults which can be caused for instance by worn or damaged insulation, and the like. Because of their intermittent and high impedance nature, arc faults do not typically generate currents of sufficient instantaneous magnitude or sufficient average current to trigger the thermo-magnetic trip device which provides the short circuit and overcurrent protection.

Various types of arc fault detectors have been developed and/or proposed. Generally, the detectors are of two types. The first type responds to the random high frequency noise caused by an arc. This high frequency noise tends to be attenuated, especially by the presence of filters on some loads which can be connected to the branch circuit. A second type of arc fault detector looks for the step increases in current each time the arc is struck.

Detection of an arc fault is complicated by the fact that some normal loads can produce waveforms similar to arc faults. Arc fault detectors attempt to distinguish over such phenomena to minimize nuisance faults. The task is further complicated by the fact that, as mentioned above, arc faults tend to be smaller in amplitude than dead faults.

It is known to provide arc fault detectors used in circuit breakers with built-in test circuits for testing their response. However, such an internal test circuit does not guarantee that the circuit breaker will respond to an actual arc fault in a branch circuit remote from the circuit breaker.

There is a need, therefore for apparatus for testing the protection provided to a branch circuit by an arc fault detector including an arc fault detector incorporated in a circuit breaker from actual arc faults occurring in a branch circuit remotely from the detector.

SUMMARY OF THE INVENTION

This need and others are satisfied by the invention which is directed to apparatus for testing an arc fault detector providing protection in an electrical circuit for arc faults occurring remotely from the detector. The apparatus includes a housing in which are mounted a fixed contact and means for mounting a moveable contact for movement into and out of contact with the fixed contact. Circuit means connect the fixed and moveable contacts in shunt across the conductors of the protected electric circuit. Actuating means include a first bias means such as a spring biasing the moveable contact away from the fixed contact and momentary closing means which momentarily overrides the first bias means and moves the moveable contact into contact with the fixed contact to short circuit the electrical conductors of the protected circuit and generate a magnetic repulsion force which, together with the first bias means, moves the moveable contact out of contact with the fixed contact to strike an arc. Where the detector is incorporated in a trip circuit of a circuit breaker, the detector should respond to the arc and trip the circuit open. In case the circuit breaker does not respond to the arc or the arc fault detector is not used to trip a circuit breaker, an overcurrent protector is included in the apparatus for limiting the current through the contacts drawn by the arc. This overcurrent protector can be a fuse or a positive temperature coefficient (PTC) element which switches from a very low resistance to a second high resistance in response to a sustained current drawn by the arc.

Preferably, the momentary closing means includes a push button and a second biasing means such as a spring coupling the push button to the means mounting the moveable contact. In a preferred embodiment of the invention, the mounting means is a pivotally mounted contact arm carrying the moveable contact. Most preferably, the first and second bias means are helical compression springs applying opposing forces to the pivotally mounting contact arm. When the push button is depressed, the second helical compression spring, which is stronger than the first spring, rotates the contact arm to close the shunt circuit by bringing the moveable contact into the physical contact with the fixed contact. The current drawn through the contacts generates a magnetic repulsion force which together with the force of the first helical compression spring, rotates the contact arm to separate the moveable contact from the fixed contact. This occurs even though the push button may be held in a depressed position. As the contacts separate, an arc is struck.

The housing includes a section through which the arc is visible. This may be accomplished by fabricating the housing of a transparent or translucent electrically insulated material, or providing a window in the housing. This capability of providing a visual indication that an arc has been struck verifies operation of the apparatus. In addition, the housing forms an enclosed chamber in which the gases generated by the arc are contained or reduced in temperature and velocity before being released from the housing.

In a particularly advantageous arrangement, the apparatus plugs into a socket in the protected electrical circuit.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
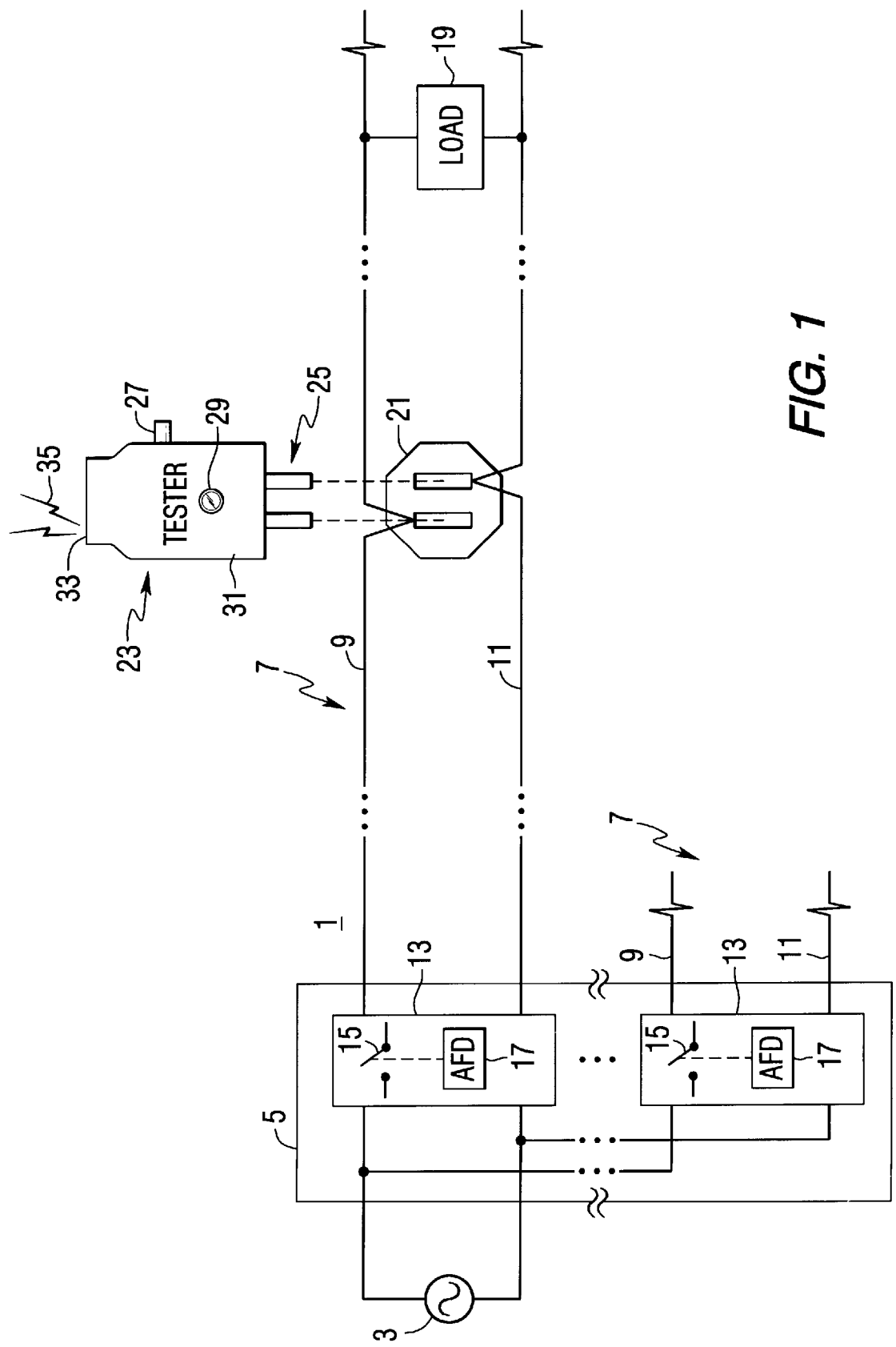
FIG. 1 is a schematic diagram of an electric distribution system showing use of the apparatus in accordance with the invention.

FIG. 1 illustrates an electric power distribution system 1 which includes a source 3 of electric power such as a public utility. The utility provides power to a control center 5 which distributes the ac power to a number of branch circuits such as the branch circuit 7 having a first, line conductor 9 and a second, neutral conductor 11. Each of the branch circuits 7 is protected by a circuit breaker 13 mounted in the control center. These circuit breakers 13 have a pair of separable contacts which, as is conventional, are opened in response to overcurrents in the branch circuits such as short circuits and overloads. The circuit breakers 13 also include an arc fault detector (AFD) 17 which responds to arcing faults in the protected branch circuit 7 and opens the separable contacts 13. The branch circuits 7 can be hard wired to one or more loads 19. They typically also include one or more sockets 21 through which additional loads can be plugged into the branch circuits.

As discussed, the arc fault detector 17 may be provided with a tester. Such a built-in test circuit tests the electronics of the detector and the trip mechanism. However, an actual arc fault could occur anywhere in the branch circuit, including locations remote from the circuit breaker 13, and therefore, from the arc fault detectors 17. Due to the considerable length of the conductors 9 and 11 between such a remote arc fault and the arc fault detector, and also due to the typically small magnitude of the arc current, the arc fault detector 17 may not be able to respond in an actual installation to such a remote arc fault. In addition, some loads 19 have input filters incorporating capacitors that can attenuate arc faults in a branch circuit, therefore masking the arc fault from the arc fault detector 17.

The invention is directed to apparatus in the form of a tester 23 which generates an actual arc at a remote location in the branch circuit to determine if the arc fault detector 17 will respond. In a preferred embodiment of the invention, the tester 23 has a plug 25 which conveniently engages the socket 21. Alternatively, the tester could have leads with connectors which penetrate insulation on the conductors 9 and 11, or other connections for connecting the tester 23 across the conductors 9 and 11 external to the circuit breaker 13.

The tester 23 is provided with a test button 27 for generating an arc in a manner to be discussed. An indicator such as a light bulb or light emitting diode (LED) 29 indicates that the branch circuit 7 is energized and therefore ready for the test when illuminated. The tester 23 has a housing 31 which is preferably made an electrically insulative resin. A section 33 of the housing transmits light 35 generated by the arc to verify operation of the tester. The section 33 of the housing can be made of a resin which is either transparent or translucent. The entire housing 31 can be molded of this transparent or translucent resin, as desired, and portions other than the section 33 can be painted or otherwise coated so that they are opaque. Alternatively the section 33 of the housing can have a transparent or translucent window inserted in an opening in the housing. The indicator 29 also provides an indication that the circuit breaker 13 responded to the arc struck by the tester by extinguishing when the conductors 9 and 11 are deenergized by tripping of the circuit breaker. Thus, the sequence for testing is to plug the tester 23 into the socket 21. The indicator 29 should illuminate to acknowledge that the branch circuit 7 is energized. The test button 27 is then depressed to strike an arc. Light 35 from the arc will be visible through the section 33 of the housing. If the circuit breaker 13 responds, the indicator 29 will go out.

Figure 2:
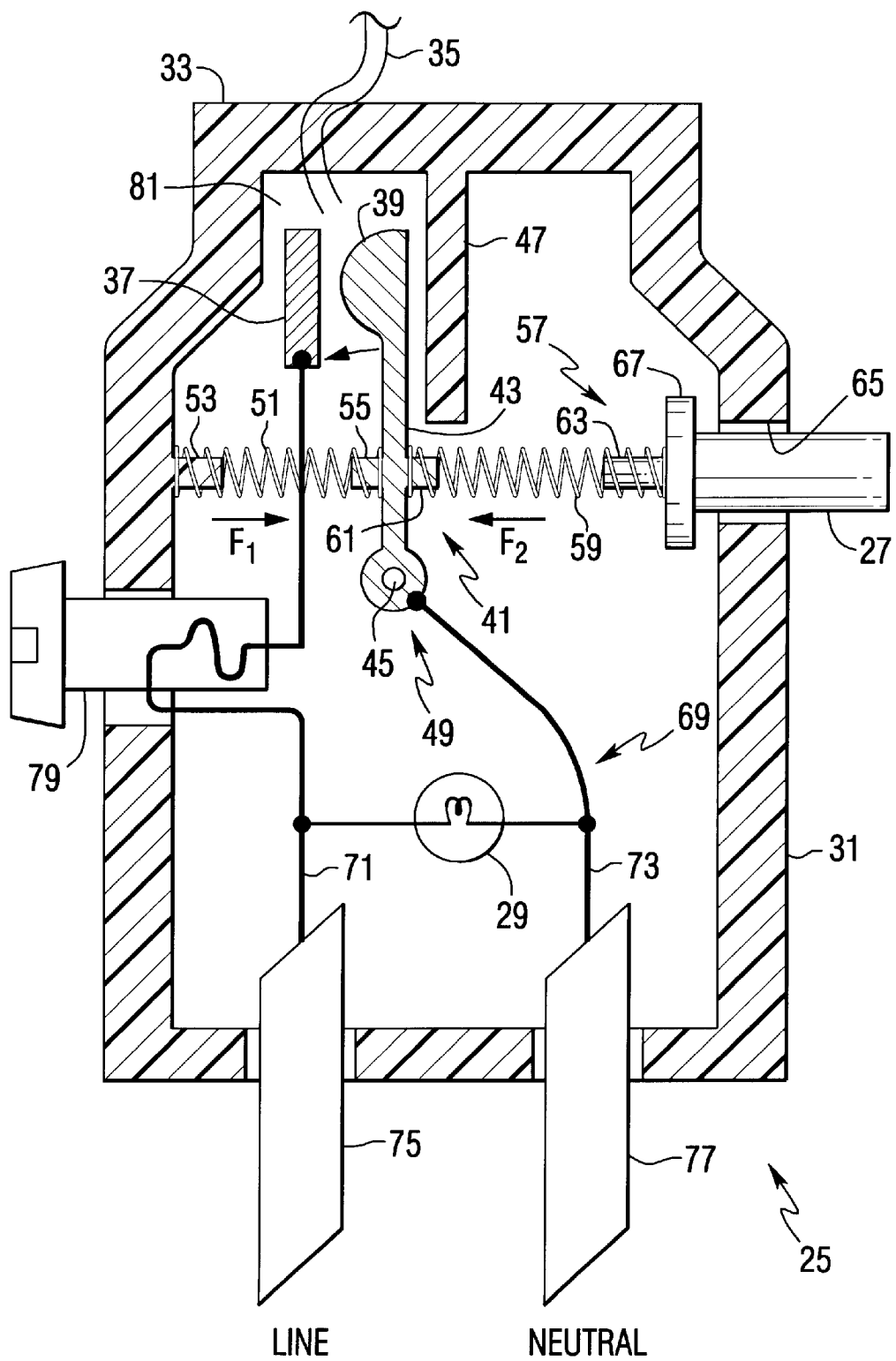
FIG. 2 is a partially schematic vertical section through apparatus in accordance with the invention.

FIG. 2 illustrates the construction of the tester 23. The tester includes a fixed or stationary contact 37 and a moveable contact 39. The mount 41 for the moveable contact 39 includes a contact arm 43 and a pivot pin 45 pivotally mounting the contact arm on one end within the housing. Moveable contact 39 is fixed to the opposite end of the contact arm 43 for pivotal movement into an out of contact with the fixed contact. A molded stop 47 fixes the open position of the moveable contact.

An actuator 49 includes a first bias device in the form of a helical compression spring 51 which is retained by molded projections 53 and 55 on the housing and the contact arm 43, respectively. The spring 51 biases the moveable contact away from the fixed contact and seats the contact arm 43 against the molded stop 47.

The actuator 49 also includes a momentary close mechanism 57 made up of the test button 27 and a second biasing device in the form of helical compression spring 59. This spring 59 extends between and couples the push button 27 to the contact arm 43 and is retained by projections 61 and 63 on the contact arm and push button, respectively. The push button 27 extends through an aperture 65 in the housing 31 and has a flange 67 which seats against the housing under the urging of the spring 59.

A circuit 69 includes electrical leads 71 and 73 which connect the fixed contact 37 and the moveable contact 39 to prongs 75 and 77 of the plug 25. It also includes the test light 29 which is connected across the leads 71 and 73. Thus, with the plug 25 engaging the socket 21, the fixed contact 37 and moveable contact 39 are connected in shunt across the conductors 9 and 11 of the branch circuit 7 along with the test light 29.

The circuit 69 also includes an overcurrent protector 79 connected in series with the fixed and moveable contacts in the lead 71. In the exemplary embodiment of the invention, the overcurrent protector 79 is a fuse. Alternatively, a positive temperature coefficient (PCT) device could be used as the current limiter 79. Such devices which are known, increase substantially in resistance in response to the heat generated by an overcurrent. Such devices are shown for example in U.S. Pat. No. 5,714,923. The current limiter 59 prevents overheating of the tester should the circuit breaker not respond to the arc.

The housing 31 forms a chamber 81 in which the contacts (37, 39) are located and which contains gases generated by the arc.

Operation of the tester 23 is as follows. With the plug 25 engaged in socket 21, the test light 29 is illuminated to indicate that the branch circuit 7 is energized. The spring 51 biases the contact arm 43 against the molded stop 47 so that the fixed contact 37 and moveable contact 39 are separated. To conduct a test of the circuit breaker 13 for response to an arc fault, the test button 27 is depressed. The force $F_2$ generated by the spring 59 exceeds the force $F_1$ generated by the spring 51 so that the contact arm 43 is pivoted counter-clockwise as viewed in FIG. 2 to bring the moveable contact 39 into contact with the fixed contact 37. This generates a short circuit across the conductors 9 and 11 which produces a repulsion force between the contacts. This repulsion force, which is increased by the oppositely flowing current in the contact arm and the adjacent lead 71, together with the spring force $F_1$ generated by the spring 51, overcome the force $F_2$ generated by the spring 59 to rotate the contact arm 43 clockwise and separate the fixed and moveable contacts 37 and 39. As the contacts open, an arc is struck giving off light 35 which can be seen through the section 33 of the housing to verify its generation. The molded stop 47 is positioned so that with the contact 43 pinned against it the arc is repetitively extinguished and restruck to generate a series of arcing current pulses. If the arc fault detector 17 in the circuit breaker 13 responds to the arcs struck in the tester, the separable contacts 15 will be opened to deenergize the branch circuit 7 and thus extinguish the arc. It will also result in deenergization of the test light 29 to verify that the circuit breaker has responded. Should the circuit breaker 13 not respond to the arc, the test light 29 will remain illuminated. The resistance of the arc will result in blowing of the fuse 79. The fixed contact 37 is preferably a carbon electrode and the moveable contact 39 is a phosphor bronze contact.

The apparatus of the invention provides a low-cost easily used tester for verifying that real arc fault detection is being provided by an arc fault circuit breaker. The coupling of the push button 27 to the contact arm 43 by the spring 59 prevents the contacts from being held closed by holding the push button in as the magnetic repulsion force and the force generated by the spring 51 will overcome the force generated by the spring 59.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. Apparatus for testing an arc fault circuit breaker protecting an electric circuit having a first conductor and a second conductor, said apparatus comprising:

a housing;

a fixed contact mounted in said housing;

a moveable contact;

means mounting said moveable contact in said housing for movement into and out of contact with said fixed said contact;

circuit means connecting said fixed contact and said moveable contact in shunt across said first and second conductors; and actuating means including first bias means biasing said moveable contact away from said fixed contact, and momentary closing means for momentarily overriding said first bias means and moving said moveable contact into contact with said fixed contact to short circuit said first and second electrical conductors and generate a magnetic repulsion force which together with said first bias means move the moveable contact out of contact with said fixed contact to strike an arc.

2. The apparatus of claim 1 wherein said circuit means includes an overcurrent protector in said housing for limiting current through said fixed contact and moveable contact.

3. The apparatus of claim 2 wherein said overcurrent protector comprises a fuse.

4. The apparatus of claim 2 wherein said overcurrent protector comprises a positive temperature coefficient element having a first low resistance, and a second high resistance in response to sustained current through said fixed contact and moveable contact.

5. The apparatus of claim 1 wherein said momentary closing means comprises a push button and a second bias means coupling said push button to said means mounting said moveable contact.

6. The apparatus of claim 5 wherein said means mounting said moveable contact comprises a pivotally mounted contact arm carrying said moveable contact.

7. The apparatus of claim 6 wherein said first bias means and second bias means each comprises a spring applying opposing forces to said pivotally mounted contact arm.

8. The apparatus of claim 7 wherein said housing includes a section through which said arc is visible.

9. The apparatus of claim 7 adapted for use with said electric circuit which includes a socket to which said first and second electrical conductors are connected and wherein said circuit means includes a plug having a pair of prongs for engaging said first and second electrical conductors through said socket, and electrical leads connecting said pair of prongs to said fixed contact and said moveable contact.

10. The apparatus of claim 9 wherein said circuit means includes an overcurrent protector connected by said electrical leads in series with said pair of prongs and said fixed contact and moveable contact for limiting current through said fixed contact and moveable contact.

11. The apparatus of claim 9 wherein said housing includes a section through which said arc is visible.

12. The apparatus of claim 11 wherein said circuit means includes an overcurrent protector connected by said leads in series with said pair of prongs and said fixed contact and moveable contact for limiting current through said fixed contact and moveable contact.

13. The apparatus of claim 5 wherein said housing includes a section through which said arc is visible.

14. The apparatus of claim 5 adapted for use with said electric circuit which includes a socket to which said first and second electrical conductors are connected and wherein said circuit means includes a plug having a pair of prongs for engaging said first and second electrical conductors through said socket, and electrical leads connecting said pair of prongs to said fixed contact and said moveable contact.

15. The apparatus of claim 5 wherein said housing has an internal chamber in which the fixed contact and said moveable contact come into contact and which contains any gases generated by said arc.

* * * * *